(12) United States Patent
Chou et al.

(10) Patent No.: US 9,450,028 B2
(45) Date of Patent: Sep. 20, 2016

(54) ORGANIC LIGHT-EMITTING DEVICE AND IMAGE DISPLAY SYSTEM EMPLOYING THE SAME

(71) Applicant: InnoLux Corporation, Miao-Li County (TW)

(72) Inventors: Cheng-Hsu Chou, Miao-Li County (TW); Jin-Ju Lin, Miao-Li County (TW); Yin-Jui Lu, Miao-Li County (TW); Yeng-Ting Lin, Miao-Li County (TW); Ming-Hung Hsu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/280,952

(22) Filed: May 19, 2014

(65) Prior Publication Data
US 2014/0353635 A1 Dec. 4, 2014

(30) Foreign Application Priority Data

May 30, 2013 (TW) .............................. 102119060 A

(51) Int. Cl.
| | |
|---|---|
| *H01L 29/08* | (2006.01) |
| *H01L 27/32* | (2006.01) |
| *H01L 51/52* | (2006.01) |
| *H01L 51/50* | (2006.01) |

(52) U.S. Cl.
CPC ......... *H01L 27/3211* (2013.01); *H01L 51/504* (2013.01); *H01L 51/5265* (2013.01)

(58) Field of Classification Search
CPC ..................... H01L 27/14609; H01L 27/3211; H01L 51/504; H01L 51/5265

USPC ............................................................. 257/40
See application file for complete search history.

(56) References Cited

U.S. PATENT DOCUMENTS

| 8,760,048 B2 | 6/2014 | Fukuda et al. | |
|---|---|---|---|
| 2009/0026921 A1* | 1/2009 | Kuma et al. | .................. 313/504 |

(Continued)

FOREIGN PATENT DOCUMENTS

| CN | 102163695 | 8/2011 |
|---|---|---|
| TW | 200704280 A | 1/2007 |

OTHER PUBLICATIONS

TW Office Action dated Apr. 30, 2015 in corresponding Taiwan application (No. 102119060).

(Continued)

*Primary Examiner* — Fernando L Toledo
*Assistant Examiner* — Neil Prasad
(74) *Attorney, Agent, or Firm* — McClure, Qualey & Rodack, LLP

(57) ABSTRACT

The disclosure provides an organic light-emitting device. The organic light-emitting device includes a substrate, and an organic light-emitting pixel array disposed on the substrate. The organic light-emitting pixel array includes a plurality of pixels. Each pixel includes a first sub-pixel and a second sub-pixel. Each sub-pixel includes a first electrode, an organic light-emitting element, a second electrode, and an optical path adjustment layer. The optical path adjustment layer is disposed between the first electrode and the second electrode. Particularly, the thickness of the optical path adjustment layer of the first sub-pixel is substantially equal to the thickness of the optical path adjustment layer of the second sub-pixel.

18 Claims, 11 Drawing Sheets

(56) References Cited

U.S. PATENT DOCUMENTS

| | | | |
|---|---|---|---|
| 2012/0243219 A1* | 9/2012 | Ohsawa | H01L 51/5265 362/230 |
| 2012/0281270 A1* | 11/2012 | Hong et al. | 359/291 |
| 2013/0082246 A1 | 4/2013 | Hasegawa | |
| 2013/0153866 A1* | 6/2013 | Chen et al. | 257/40 |

OTHER PUBLICATIONS

Search Report in TW Office Action dated Apr. 30, 2015 in corresponding Taiwan application (No. 102119060).

Chinese language office action dated Mar. 28, 2016, issued in application No. CN 201310208507.1.

* cited by examiner

ORGANIC LIGHT-EMITTING DEVICE AND IMAGE DISPLAY SYSTEM EMPLOYING THE SAME

CROSS REFERENCE TO RELATED APPLICATIONS

This application is based upon and claims the benefit of priority from the prior Taiwan Patent Application No. 102119060, filed on May 30, 2013, the entire contents of which are incorporated herein by reference.

BACKGROUND

1. Technical Field

The disclosure relates to an organic light-emitting device, and more particularly to an organic light-emitting device with high light extraction efficiency.

2. Related Art

Recently, with the development and wide application of electronic products such as mobile phones, personal digital assistants, and notebook computers, there has been an increased demand for flat display devices which consume less power and occupy less space. Organic electroluminescent devices are self-emitting and highly luminous, have a wide viewing angle, fast response time, and simple fabrication process, making them an industry display of choice. The organic electroluminescent device is a light-emitting diode that uses an organic electroluminescent layer serving as an active layer and is being employed more and more in flat panel displays. One trend in organic electroluminescent display technology is for achieving higher luminescent efficiency.

A full-color display can be prepared by following methods: (a) RGB pixels side-by-side configuration, (b) color conversion, and (c) white OELD with color filters. In particular, white light emitted from a white organic light-emitting diode is converted to RGB by passing through the RGB color filters. However the RGB emission spectrum of the white OLED does not precisely correspond to the RGB transmission spectrum of RGB color filters, the spectral FWHM (Full Width Half Maximum) of the filtered RGB luminescence has been enlarged, such that color saturation (NTSC ratio) of the full-color display employing the white OLED and RGB color filters has been reduced, limiting the color range thereof. Furthermore, the RGB pixels side-by-side configuration indicates that red, green and blue color pixels are formed, and then driven by bias voltages to emit red, green and blue, respectively. The individual aging rates of RGB organic electroluminescent materials, however, are different and lead to color deterioration of the organic electroluminescent device after a period of time.

Therefore, it is necessary to develop a simple and efficient manufacturing method and structure for a full-color organic electroluminescent device in order to solve the aforementioned problems.

SUMMARY

An embodiment of the disclosure provides an organic light-emitting device, including a substrate, and, an organic light-emitting pixel array disposed on the substrate. In particular, the organic light-emitting pixel array includes a plurality of pixels, and each pixel comprises a first sub-pixel and a second sub-pixel, wherein each first sub-pixel and second sub-pixel includes a first electrode disposed on the substrate, an organic light-emitting element disposed on the first electrode, a second electrode disposed on the organic light-emitting element, and an optical path adjustment layer disposed between the first electrode and the second electrode. In particular, the organic light-emitting element includes a first color light-emitting layer and a second color light-emitting layer, wherein the first color light-emitting layer emits a first color light, and the second color light-emitting layer emits a second color light. It should be noted that the thickness of the optical path adjustment layer of the first sub-pixel is substantially the same as the thickness of the optical path adjustment layer of the second sub-pixel.

Another embodiment of the disclosure provides a display system, including an electronic device. The electronic device includes a display device and an input unit. The display device includes the above organic light-emitting device. The input unit is coupled to the display device to provide input data to the display device such that the display device displays images.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the disclosure and do not limit the scope of the invention.

Figure 1:
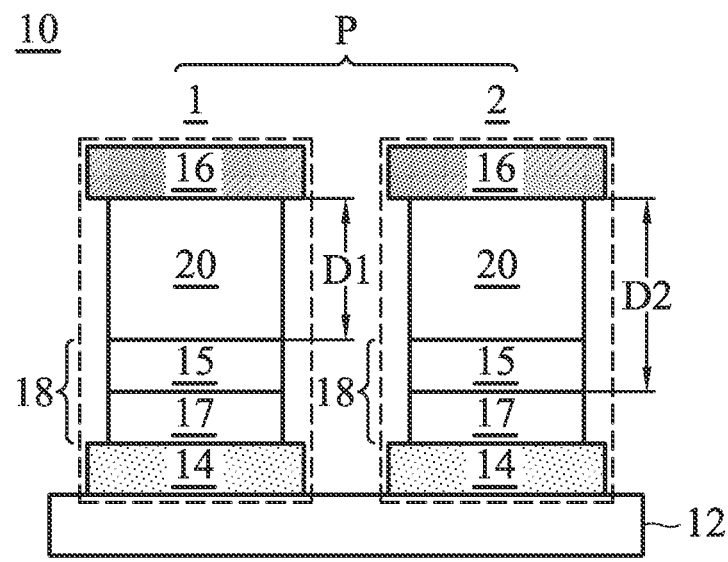
FIGS. 1, 2, 3A, 4, 5A, 6A, 7A, and 8 are cross-sectional views showing structure of the pixel of the organic light-emitting device according to embodiments of the disclosure.

An embodiment of the disclosure discloses an organic light-emitting device 10, as shown in FIG. 1. The organic light-emitting device 10 includes a substrate 12 and an organic light-emitting pixel array (not shown), wherein the organic light-emitting pixel array includes a plurality of pixels P. Each of the pixels P includes at least one first sub-pixel 1, and a second sub-pixel 2. According an embodiment of the disclosure, the pixel P can also include three or more sub-pixels. In particular, the first sub-pixel 1 and second sub-pixel 2 can each include a first electrode 14 disposed on substrate 12, an organic light-emitting element 18 disposed on first electrode 14, a second electrode 16 disposed on the organic light-emitting element 18, and an optical path adjustment layer 20 disposed between the second electrode 16 and the organic light-emitting element 18, wherein the organic light-emitting element 18 includes a first color light-emitting layer 15 and a second color light-emitting layer 17. It should be noted that the first color light-emitting layer 15 in the first sub-pixel 1 emits a first color light, and the first color light generates a first standing wave (not shown) within the first sub-pixel 1. Further, the first color light-emitting layer 15 of the first sub-pixel 1 can be positioned at an antinode of the first standing wave. In addition, the second color light-emitting layer 17 in the second sub-pixel 2 emits a second color light, and the second color light generates a second standing wave (not shown) within the second sub-pixel 2. Further, the second color light-emitting layer 17 of the second sub-pixel 2 can be positioned at an antinode of the second standing wave. Moreover, the first color light is different from the second color light, and the material of the first color light-emitting layer 15 is different from that of the second color light-emitting layer 17. For example, the first color light can be a blue light, and the second color light can be a red light. Therefore, the first color light-emitting layer 15 can be a blue light-emitting layer, and the second color light-emitting layer 17 can be a red light-emitting layer.

In addition, according an embodiment of the disclosure, all films (including the first electrode 14, organic light-emitting element 18, second electrode 16, and optical path adjustment layer 20) of the first sub-pixel 1 and the second sub-pixel 2 are formed by the same materials and the same process simultaneously. Therefore, the first electrode 14, organic light-emitting element 18, second electrode 16, and optical path adjustment layer 20 of the first sub-pixel 1 are the same or substantially the same as the first electrode 14, organic light-emitting element 18, second electrode 16, or optical path adjustment layer 20 of the second sub-pixel 2 respectively in thickness and material. Moreover, under the premise that the first color light-emitting layer 15 of the first sub-pixel 1 is positioned at the antinode of the first standing wave and the second color light-emitting layer 17 of the second sub-pixel 2 is positioned at the antinode of the second standing wave, the optical path adjustment layer 20 of the first sub-pixel 1 has the same or substantially the same materials and thickness as the optical path adjustment layer 20 of the second sub-pixel 2. Herein, the term "substantially the same" means that the difference between the thickness of the optical path adjustment layer of the first sub-pixel and the thickness of the optical path adjustment layer of the second sub-pixel is between 5% and −5%, based on the sum of the thickness of the optical path adjustment layer of the first sub-pixel and the thickness of the optical path adjustment layer of the second sub-pixel. Namely, the aforementioned thickness relationship can be expressed by the following formula: $(T1-T2)/(T1+T2) \times 100\% \leq \pm 5\%$, wherein T1 means the thickness of the optical path adjustment layer of the first sub-pixel, and T2 means the thickness of the optical path adjustment layer of the second sub-pixel). The difference between the thickness of the optical path adjustment layer of the first sub-pixel and the thickness of the optical path adjustment layer of the second sub-pixel results from the manufacturing deviation, although the processes for forming the optical path adjustment layers of the first sub-pixel and second sub-pixel use the same steps and the same material. Accordingly, since all of the layer material and layer thickness of the first sub-pixel 1 and the second sub-pixel 2 are identical, the organic light-emitting device has the advantages of a simplified manufacturing process and an increased luminous efficiency of light-emitting layers due to the microcavity effect.

As still shown in FIG. 1, the optical path adjustment layer 20 of the first sub-pixel 1 contacts the second electrode 16, and the optical path adjustment layer 20 of the second sub-pixel 2 also contacts the second electrode 16. In this embodiment, the minimum optical path length D1 of the first color light (such as blue light) from the first color light-emitting layer 15 (such as a blue light-emitting layer) of the first sub-pixel 1 to the second electrode 16 is between 194 nm and 351 nm (In FIG. 1, the distance D1 means the minimum optical path length of the first color light from the first color light-emitting layer 15 to the second electrode 16). Further, the minimum optical path length D2 of the second color light (such as red light) from the second color light-emitting layer 17 (such as a red light-emitting layer) of the second sub-pixel 2 to the second electrode 16 is between 327 nm and 505 nm (In FIG. 2, the distance D2 means the minimum optical path length of the second color light from the second color light-emitting layer 17 to the second electrode 16). The term "optical path length" is used to describe the effective distance traveled by light in a medium. The optical path length is determined by the product of the thickness and the refractive index of layers between the light-emitting layer and the electrode (such as a second electrode) and defined by the following equation:

$$OP = n*D = n1*d1 + n2*d2 + \ldots + nm*dm,$$

wherein OP means the optical path length; D means the total thickness of the layers between the light-emitting layer and the electrode; n means the average refractive index of the layers between the light-emitting layer and the electrode; ni (i=1, 2, . . . , m) means the refractive index of the layer (i); and di (i=1, 2, . . . , m) means the thickness of the layer (i).

Figure 2:
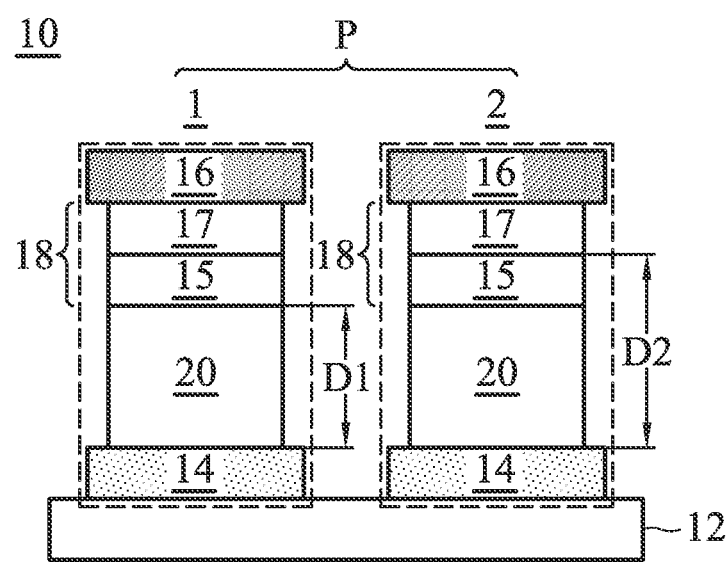

According to another embodiment of the disclosure, the optical path adjustment layers 20 of the first sub-pixel 1 and the second sub-pixel 2 can be disposed between the first electrode 14 and the organic light-emitting element 18, as shown in FIG. 2. Namely, the optical path adjustment layer 20 is directly formed on and contacted to the first electrode 14. In addition, the minimum optical path length D1 of the first color light (such as blue light) from the first color light-emitting layer 15 (such as a blue light-emitting layer) of the first sub-pixel 1 to the first electrode 14 can also be between 194 nm and 351 nm (In FIG. 2, the distance D1 means the minimum optical path length of the first color light from the first electrode 14 to the first color light-emitting layer 15). On the other hand, the minimum optical path length D2 of the second color light (such as red light) from the second color light-emitting layer 17 (such as a red light-emitting layer) of the second sub-pixel 2 to the first electrode 14 can also be between 327 nm and 505 nm (In FIG. 2, the distance D2 means the minimum optical path length of the second color light from the first electrode 14 to the second color light-emitting layer 17).

According to some embodiments of the disclosure, the material of the substrate 12 can be quartz, glass, silicon, metal, plastic, or ceramic materials. Furthermore, the substrate 12 can be a substrate having active elements, such as a thin-film transistor substrate. The organic light-emitting device 10 can be a top-emission organic light-emitting device, a bottom-emission organic light-emitting device, or a transparent organic light-emitting device. When the organic light-emitting device 10 is a top-emission organic light-emitting device, the first electrode 14 can be a reflecting electrode, and the second electrode 16 can be a transparent electrode or a transflective electrode. On the other hand, when the organic light-emitting device 10 is a bottom-emission organic light-emitting device, the first electrode 14 can be a transparent electrode or a transflective electrode and the second electrode 16 can be a reflecting electrode. Suitable material for the reflecting electrode can include aluminum (Al), copper (Cu), molybdenum (Mo), titanium (Ti), platinum (Pt), iridium (Ir), nickel (Ni), chromium (Cr), silver (Ag), gold (Au), tungsten (W), palladium (Pd), or an alloy thereof. Suitable material for the transparent electrode can include indium tin oxide (ITO), indium zinc oxide (IZO), or a transparent conductive layer made of metal oxide. The transflective electrode can be a semi-transparent metal layer made of a single layer or a multi-layer film. The transflective electrode can be a thin metal layer including aluminum (Al), copper (Cu), molybdenum (Mo), titanium (Ti), platinum (Pt), iridium (Ir), nickel (Ni), chromium (Cr), silver (Ag), gold (Au), tungsten (W), magnesium (Mg), or an alloy thereof. Furthermore, the transflective electrode can be a multi-layer film including metal layers and/or a transparent conductive layer.

The organic light-emitting element 18 can include at least two light-emitting layers (such as a first color light-emitting layer 15 and a second color light-emitting layer 17). In addition, according to other embodiments of the disclosure, the organic light-emitting element 18 can include at least three light-emitting layers. Moreover, besides the light-emitting layer, the organic light-emitting element 18 further includes other optional layers (such a hole transport layer, a hole injection layer, an electron transport layer, an electron injection layer, a charge generation layer, or a carrier blocking layer). The layers of the organic light-emitting element 18 can be an organic semiconductor material (such as organic small molecule material, or polymer material) or organic-metallic materials, and can be formed by thermal vacuum evaporation, physical vapor deposition, chemical vapor deposition (organic small molecule material), spin coating, ink jetprinting, or screen printing (polymer material) methods. In addition, each light-emitting layer of the organic light-emitting element 18 can include a light-emitting material and further includes an electroluminescent dopant doped into the light-emitting material. The dose of the dopant is not limited and can be optionally modified by a person of ordinary skill in the field. The dopant can perform energy transfer or carrier trapping under electron-hole recombination in the light-emitting layer. The light-emitting material can be fluorescent or phosphorescent materials. The materials of the layers of the organic light-emitting element are not limited and can be optionally modified by a person of ordinary skill in the field.

According to some embodiments of the disclosure. Suitable material for the optical path adjustment layer 20 can be hole injection or transport material, electron injection or transport material, transparent connecting material, or a combination thereof. For example, the optical path adjustment layer 20 can be a transparent conductive layer, a hole injection layer, an electron transport layer, or a combination thereof. The optical path adjustment layer 20 is used to adjust the location of the light-emitting layer of the organic light-emitting element 18 in the sub-pixels, resulting in the light-emitting layer being positioned at an antinode of a standing wave generated in the sub-pixel. According to the electromagnetic theory, when the light-emitting layer is positioned at a position around the antinode of a standing wave, the luminous intensity of the light-emitting layer can be enhanced due to the microcavity effect. For example, the optical path adjustment layers of the blue sub-pixel, the green sub-pixel, and the red sub-pixel have a specific thickness, resulting in the blue light-emitting layer of the blue sub-pixel, the green light-emitting layer of the green sub-pixel, and the red light-emitting layer of the red sub-pixel being positioned at the antinodes of standing waves within the blue, green, and red sub-pixels respectively. One of the key features of this disclosure is that the thickness of the optical path adjustment layer of the blue sub-pixel and the thickness of the optical path adjustment layer of the red sub-pixel are controlled to be the same or substantially the same, on the premise that the blue light-emitting layer of the blue sub-pixel is positioned at the antinode of a standing wave of blue light and the red light-emitting layer of the red sub-pixel is positioned at the antinode of a standing wave of red light. Accordingly, the optical path adjustment layers of the red sub-pixel and blue sub-pixel can be formed in the same processing step, and thus an additional processing step for forming an optical path adjustment layer with different thickness in comparison with the optical path adjustment layer 20 of the blue sub-pixel B can be saved, thereby simplifying the process.

Figure 3A:
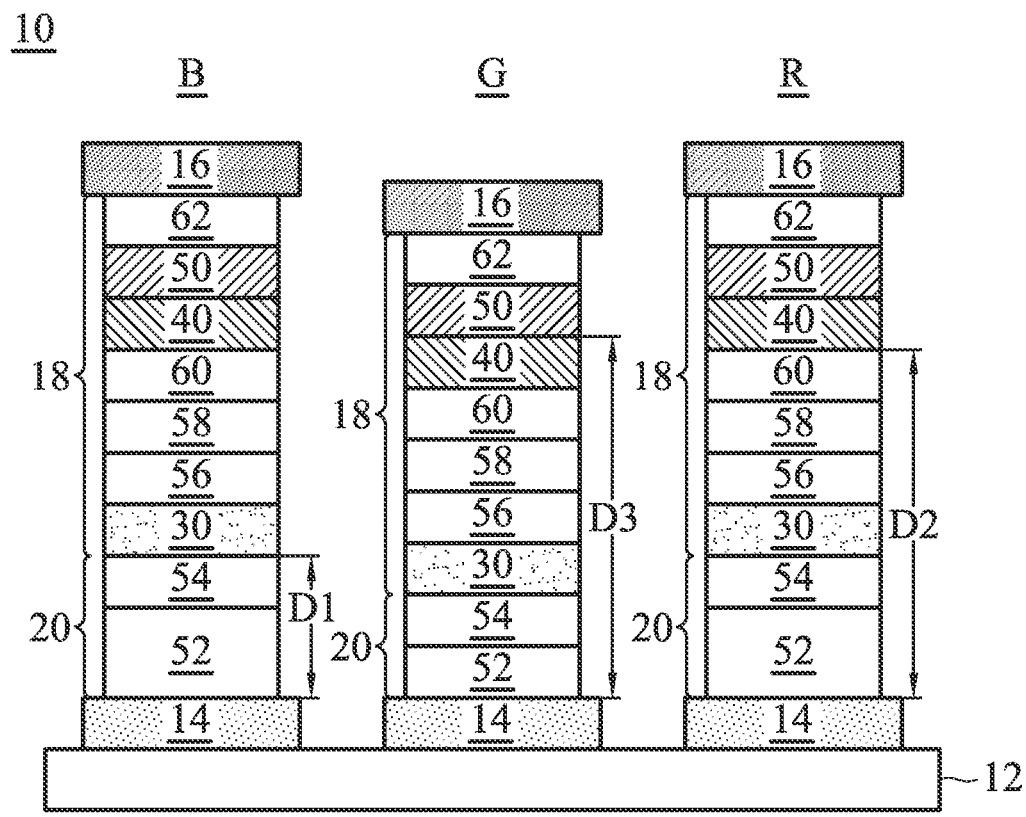

According to some embodiments of the disclosure, the pixel of the disclosure can further include a third sub-pixel. FIG. 3A shows a top-emission organic light-emitting device 10, according to an embodiment of the disclosure, wherein each pixels of the top-emission organic light-emitting device 10 includes a blue sub-pixel B, a green sub-pixel G, and a red sub-pixel R.

Please still referring to FIG. 3A, each blue sub-pixel B, green sub-pixel G, and red sub-pixel R includes a first electrode 14 (a reflecting electrode), an optical path adjustment layer 20 formed on the first electrode 14, an organic light-emitting element 18 formed on the optical path adjustment layer 20, a second electrode 16 (a transflective electrode) formed on the organic light-emitting element 18. In particular, the organic light-emitting element 18 subsequently includes a blue light-emitting layer 30, an electron transport layer 56, a charge generation layer 58, a hole injection layer 60, a red light-emitting layer 40, a green light-emitting layer 50, and an electron transport layer 62. The optical path adjustment layer 20 includes a transparent conductive layer 52, and a hole injection layer 54.

It should be noted that the blue sub-pixel B and the red sub-pixel R have the same layers. Namely, the material and thickness of the layer (such as first electrode 14, organic light-emitting element 18, second electrode 16, or optical path adjustment layer 20) of the blue sub-pixel B is the same as the material and thickness of the corresponding layer of the red sub-pixel R (i.e. the sub-pixel B and red sub-pixel R are formed by the same process steps). In addition, the material and thickness of the layer (such as first electrode 14, organic light-emitting element 18, or second electrode 16) of the blue sub-pixel B (or red sub-pixel R) is the same as the material and thickness of the corresponding layer of the green sub-pixel G (i.e. the first electrode 14, the organic light-emitting element 18, or the second electrode 16 of the sub-pixel B, the red sub-pixel R, and the green sub-pixel G are formed by the same process steps). Furthermore, the thickness of the optical path adjustment layer of the green sub-pixel G is different from the thickness of the optical path adjustment layer of the blue sub-pixel B (or red sub-pixel R).

In detail, the thickness of the hole injection layer 54 of the optical path adjustment layer 20 of the blue sub-pixel B, the red sub-pixel R, and the green sub-pixel G is fixed in this embodiment. Therefore, the thickness of the optical path adjustment layer 20 can be controlled by increasing or reducing the thickness of the transparent conductive layer 52 of the optical path adjustment layer 20, resulting in the blue light-emitting layer 30 of the blue sub-pixel B, the red light-emitting layer 40 of the red sub-pixel R, and the green light-emitting layer 50 of the green sub-pixel G being positioned at the antinodes of corresponding standing waves respectively. In this embodiment, the minimum optical path length D1 of the blue light from the blue light-emitting layer 30 to the first electrode 14 in the blue sub-pixel B, the minimum optical path length D3 of the green light from the green emitting layer 50 to the first electrode 14 in the green sub-pixels G, and the minimum optical path length D2 of the red light from the red light-emitting layer 40 to the first electrode 14 in the red sub-pixel R are determined by the resonance equation and the antinode equation, resulting in that the thickness of the optical path adjustment layer 20 of the blue sub-pixel B is the same or substantially the same as the thickness of the optical path adjustment layer 20 of the red sub-pixel R (i.e. the thickness of the transparent conductive layer 52 of the blue sub-pixel B is the same or substantially the same as the thickness of the transparent conductive layer 52 of the red sub-pixel R). Therefore, an additional processing step for forming an optical path adjustment layer with different thickness in comparison with the optical path adjustment layer 20 of the blue sub-pixel B can be saved.

Figure 3B:
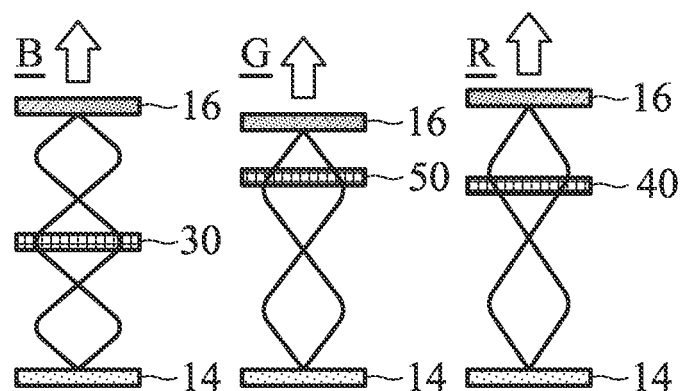
FIGS. 3B, 5B, 6B, and 7B are schematic diagrams of standing waves within the sub-pixels of the organic light-emitting device shown in FIGS. 3A, 5A, 6A, and 7A, respectively.

In this embodiment, the minimum optical path length D1 can range between 229 nm and 343 nm (such as 286 nm), the minimum optical path length D2 can range between 328 nm and 484 nm (such as 406 nm), and the minimum optical path length D3 can range between 280 nm and 410 nm (such as 345 nm). As shown in FIG. 3B, the blue color light-emitting layer 30 of the blue sub-pixel B is positioned at a second antinode, which is calculated from the first electrode 14 (reflecting electrode), of the standing wave of the blue light in the blue sub-pixel B; the red color light-emitting layer 40 of the red sub-pixel R is positioned at a second antinode, which is calculated from the first electrode 14 (reflecting electrode), of the standing wave of the red light in the red sub-pixel R; and the green color light-emitting layer 50 of the green sub-pixel G is positioned at a second antinode, which is calculated from the first electrode 14 (reflecting electrode), of the standing wave of the green light in the green sub-pixel G. Furthermore, the blue color light-emitting layer 30 of the blue sub-pixel B is positioned at a second antinode, which is calculated from the second electrode 16 (transflective electrode), of the standing wave of the blue light in the blue sub-pixel B; the red color light-emitting layer 40 of the red sub-pixel R is positioned at a first antinode, which is calculated from the second electrode 16 (transflective electrode), of the standing wave of the red light in the red sub-pixel R; and the green color light-emitting layer 50 of the green sub-pixel G is positioned at a first antinode, which is calculated from the second electrode 16 (transflective electrode), of the standing wave of the green light in the green sub-pixel G.

According to some embodiments of the disclosure, the organic light-emitting device 10 can be a top-emission organic light-emitting device. The thickness of the transparent conductive layers 52 in the blue sub-pixel B, the red sub-pixel R, and the green sub-pixel G can be fixed. Therefore, the thickness of the optical path adjustment layers 20 in the blue sub-pixel B, the red sub-pixel R, and the green sub-pixel G can be adjusted by increasing or reducing the thickness of the hole injection layer 54 in the blue sub-pixel B, the red sub-pixel R, and the green sub-pixel G, as shown in FIG. 4.

Figure 4:
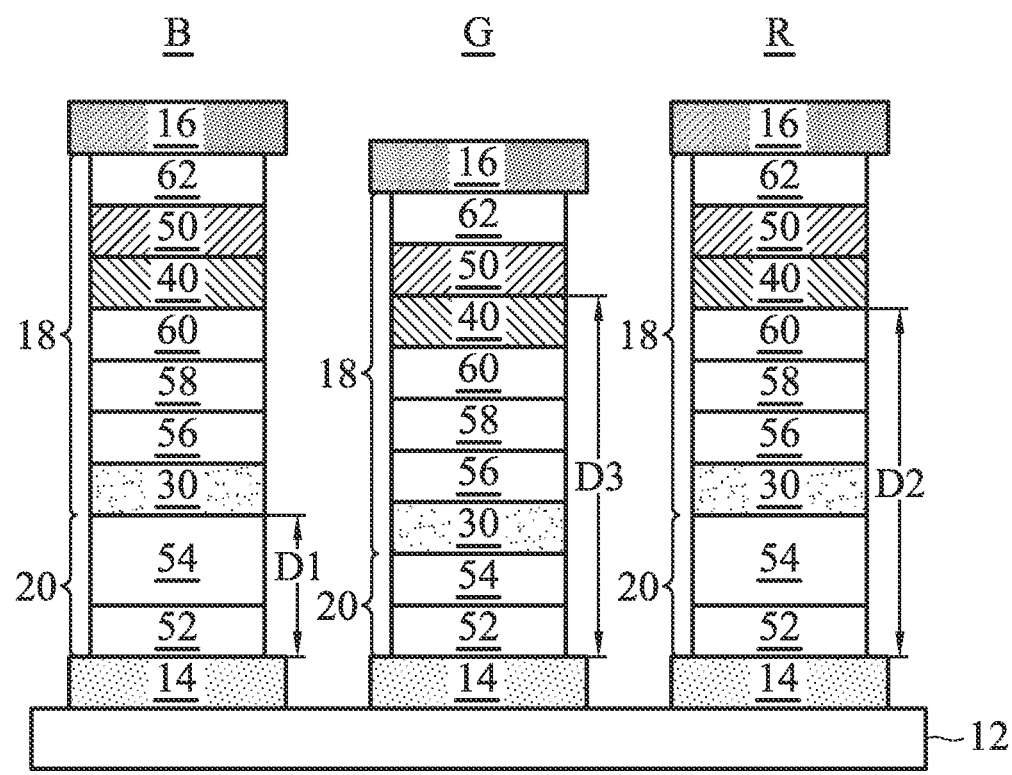

The difference between the embodiments shown in FIG. 3A and FIG. 4 is that the thickness of the optical path adjustment layer 20 of the embodiment shown in FIG. 4 is controlled by adjusting the thickness of the hole injection layer 54. The minimum optical path length D1, the minimum optical path length D2, and the minimum optical path length D3 shown in FIG. 3A are respectively the same as the minimum optical path length D1, the minimum optical path length D2, and the minimum optical path length D3 shown in FIG. 4. In the embodiment shown in FIG. 4, the blue color light-emitting layer 30 of the blue sub-pixel B is positioned at a second antinode, which is calculated from the first electrode 14 (reflecting electrode), of the standing wave of the blue light in the blue sub-pixel B; the red color light-emitting layer 40 of the red sub-pixel R is positioned at a second antinode, which is calculated from the first electrode 14 (reflecting electrode), of the standing wave of the red light in the red sub-pixel R; and the green color light-emitting layer 50 of the green sub-pixel G is positioned at a second antinode, which is calculated from the first electrode 14 (reflecting electrode), of the standing wave of the green light in the green sub-pixel G. Furthermore, the blue color light-emitting layer 30 of the blue sub-pixel B is positioned at a second antinode, which is calculated from the second electrode 16 (transflective electrode), of the standing wave of the blue light in the blue sub-pixel B; the red color light-emitting layer 40 of the red sub-pixel R is positioned at a first antinode, which is calculated from the second electrode 16 (transflective electrode), of the standing wave of the red light in the red sub-pixel R; and the green color light-emitting layer 50 of the green sub-pixel G is positioned at a first antinode, which is calculated from the second electrode 16 (transflective electrode), of the standing wave of the green light in the green sub-pixel G (The schematic diagram of the embodiment shown in FIG. 4 is the same as FIG. 3B).

Figure 5A:
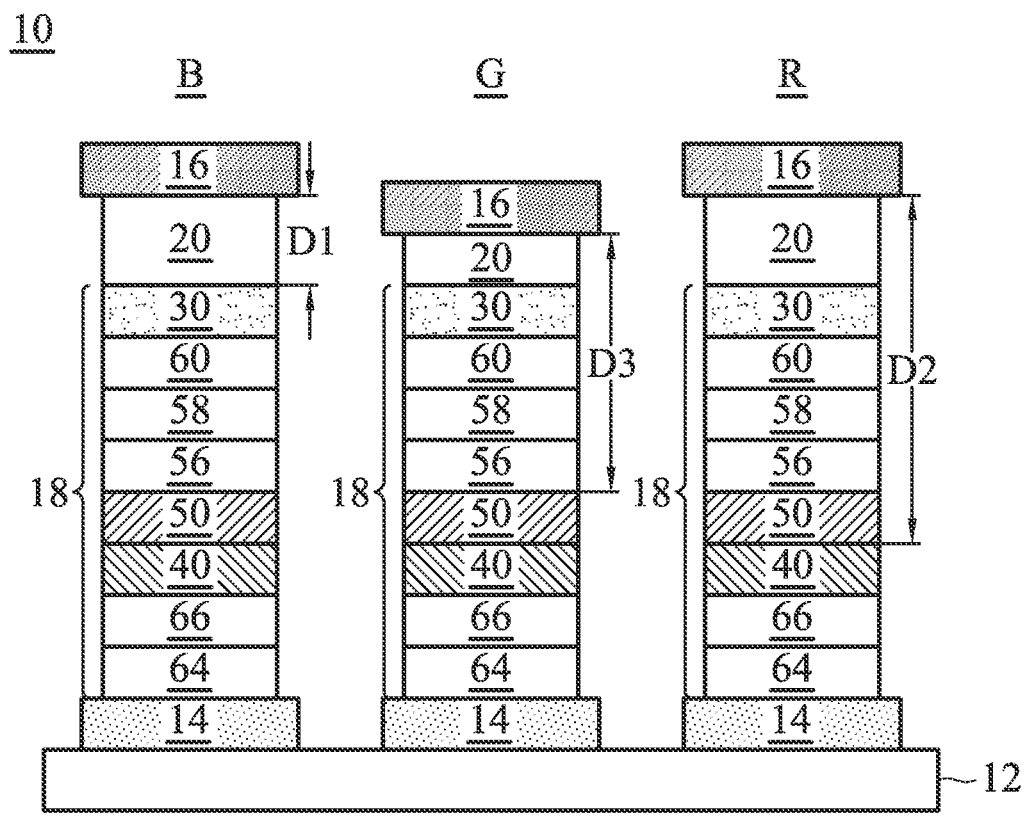

According to another embodiment of the disclosure, the organic light-emitting device 10 can be a top-emission organic light-emitting device, and the optical path adjustment layer 20 can consist of an electron transport layer, as shown in FIG. 5A. In the embodiment of FIG. 5A, the optical path adjustment layer 20 is positioned between the second electrode 16 and the organic light-emitting element 18. Therefore, the organic light-emitting element 18 subsequently includes: a transparent conductive layer 64, a hole injection layer 66, a red light-emitting layer 40, a green light-emitting layer 50, an electron transport layer 56, a charge generation layer 58, a hole injection layer 60, and a blue light-emitting layer 30, in the direction from the first electrode 14 to the second electrode 16. In this embodiment, since the optical path adjustment layer 20 consist of an electron transport layer, the blue light-emitting layer 30 of the blue sub-pixels B, the red light-emitting layer 40 of the red sub-pixels R, and the green light-emitting layer 50 of the green sub-pixels G can be positioned at antinodes of corresponding standing waves by adjusting the respective optical path adjustment layers in each sub-pixel.

In this embodiment, the minimum optical path length D1 of the blue light from the blue light-emitting layer 30 to the second electrode 16 in the blue sub-pixel B, the minimum optical path length D3 of the green light from the green emitting layer 50 to the second electrode 16 in the green sub-pixels G, and the minimum optical path length D2 of the red light from the red light-emitting layer 40 to the second electrode 16 in the red sub-pixel R are determined by the resonance equation and the antinode equation, resulting in that the thickness of the optical path adjustment layer 20 of the blue sub-pixel B is the same or substantially the same as the thickness of the optical path adjustment layer 20 of the red sub-pixel R. Therefore, an additional processing step for forming an optical path adjustment layer with different thickness in comparison with the optical path adjustment layer 20 of the blue sub-pixel B can be saved.

Figure 5B:
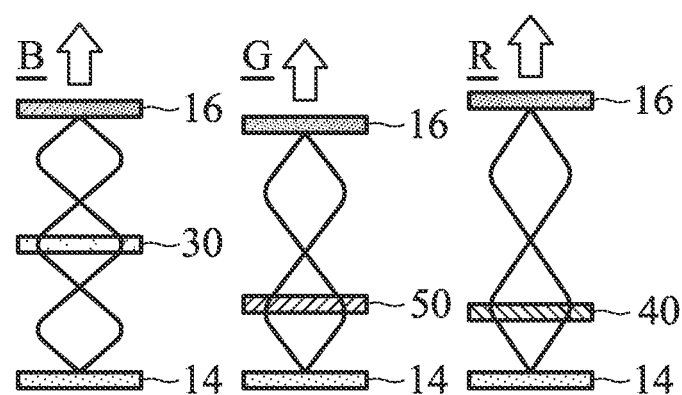

In this embodiment, the minimum optical path length D1 can range between 202 nm and 316 nm (such as 259 nm), the minimum optical path length D2 can range between 344 nm and 500 nm (such as 422 nm), and the minimum optical path length D3 can range between 233 nm and 363 nm (such as 298 nm). As shown in FIG. 5B, the blue color light-emitting layer 30 of the blue sub-pixel B is positioned at a second antinode, which is calculated from the first electrode 14 (reflecting electrode), of the standing wave of the blue light in the blue sub-pixel B; the red color light-emitting layer 40 of the red sub-pixel R is positioned at a first antinode, which is calculated from the first electrode 14 (reflecting electrode), of the standing wave of the red light in the red sub-pixel R; and the green color light-emitting layer 50 of the green sub-pixel G is positioned at a first antinode, which is calculated from the first electrode 14 (reflecting electrode), of the standing wave of the green light in the green sub-pixel G. Furthermore, the blue color light-emitting layer 30 of the blue sub-pixel B is positioned at a second antinode, which is calculated from the second electrode 16 (transflective electrode), of the standing wave of the blue light in the blue sub-pixel B; the red color light-emitting layer 40 of the red sub-pixel R is positioned at a second antinode, which is calculated from the second electrode 16 (transflective electrode), of the standing wave of the red light in the red sub-pixel R; and the green color light-emitting layer 50 of the green sub-pixel G is positioned at a second antinode, which is calculated from the second electrode 16 (transflective electrode), of the standing wave of the green light in the green sub-pixel G.

Figure 6A:
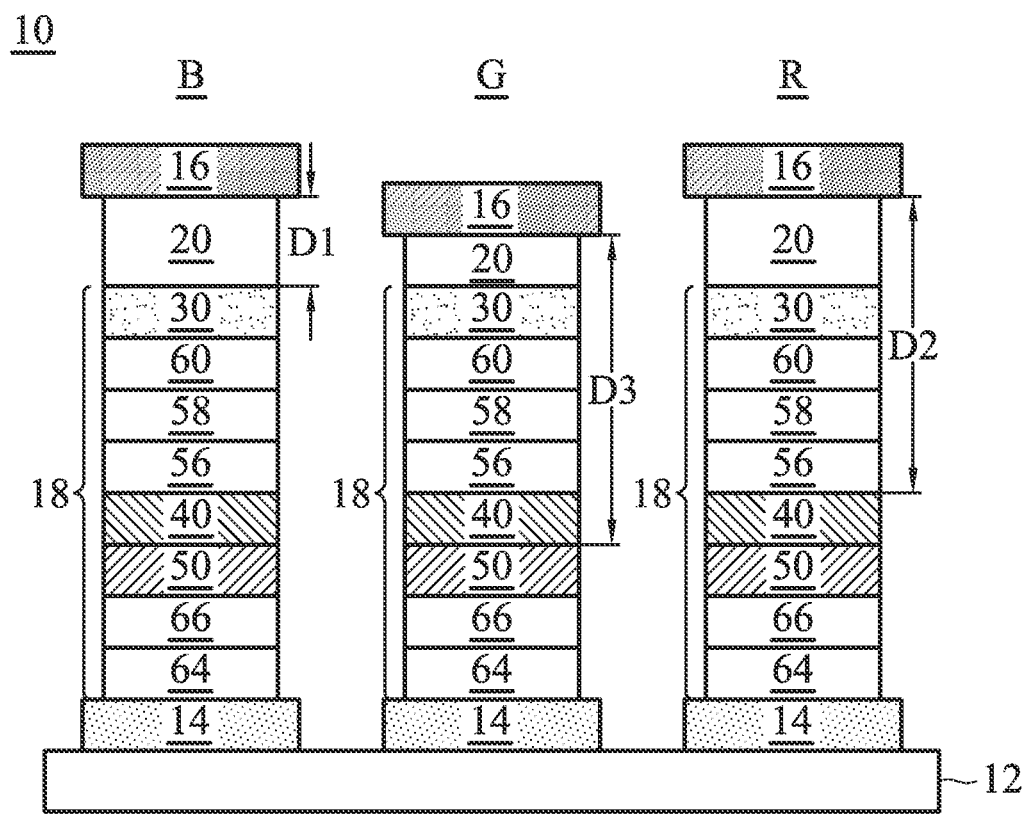

According to another embodiment of the disclosure, the organic light-emitting device 10 can be a bottom-emission organic light-emitting device as shown in FIG. 6A. In particular, the first electrode 14 is a transflective electrode, and the second electrode 16 is a reflecting electrode.

In the embodiment of FIG. 6A the optical path adjustment layer 20 can consist of an electron transport layer, and the optical path adjustment layer 20 is positioned between the second electrode 16 and the organic light-emitting element 18. In this embodiment, the blue light-emitting layer 30 of the blue sub-pixels B, the red light-emitting layer 40 of the red sub-pixels R, and the green light-emitting layer 50 of the green sub-pixels G can be positioned at antinodes of corresponding standing waves respectively by adjusting the optical path adjustment layers in each sub-pixel.

The minimum optical path length D1 of the blue light from the blue light-emitting layer 30 to the second electrode 16 in the blue sub-pixel B, the minimum optical path length D3 of the green light from the green emitting layer 50 to the second electrode 16 in the green sub-pixels G, and the minimum optical path length D2 of the red light from the red light-emitting layer 40 to the second electrode 16 in the red sub-pixel R are determined by the resonance equation and the antinode equation, resulting in that the thickness of the optical path adjustment layer 20 of the blue sub-pixel B is the same or substantially the same as the thickness of the optical path adjustment layer 20 of the red sub-pixel R. Therefore, an additional processing step for forming an optical path adjustment layer with different thickness in comparison with the optical path adjustment layer 20 of the blue sub-pixel B can be saved.

Figure 6B:
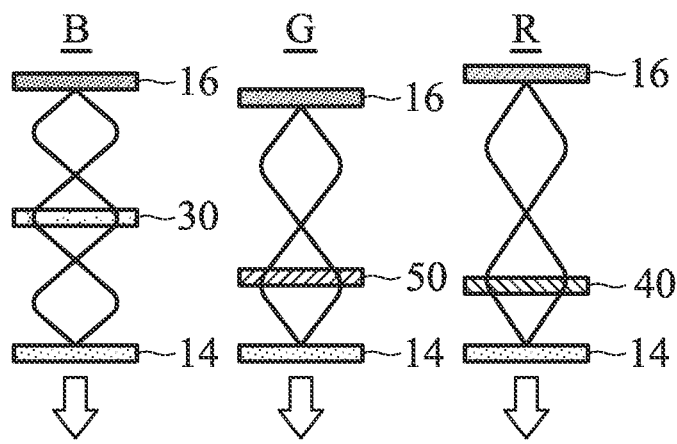

In this embodiment, the minimum optical path length D1 can range between 194 nm and 308 nm (such as 251 nm), the minimum optical path length D2 can range between 327 nm and 483 nm (such as 405 nm), the minimum optical path length D3 can range between 279 nm and 409 nm (such as 344 nm). As shown in FIG. 6B, the blue color light-emitting layer 30 of the blue sub-pixel B is positioned at a second antinode, which is calculated from the first electrode 14 (transflective electrode), of the standing wave of the blue light in the blue sub-pixel B; the red color light-emitting layer 40 of the red sub-pixel R is positioned at a first antinode, which is calculated from the first electrode 14 (transflective electrode), of the standing wave of the red light in the red sub-pixel R; and the green color light-emitting layer 50 of the green sub-pixel G is positioned at a first antinode, which is calculated from the first electrode 14 (transflective electrode), of the standing wave of the green light in the green sub-pixel G. Furthermore, the blue color light-emitting layer 30 of the blue sub-pixel B is positioned at a second antinode, which is calculated from the second electrode 16 (reflecting electrode), of the standing wave of the blue light in the blue sub-pixel B; the red color light-emitting layer 40 of the red sub-pixel R is positioned at a second antinode, which is calculated from the second electrode 16 (reflecting electrode), of the standing wave of the red light in the red sub-pixel R; and the green color light-emitting layer 50 of the green sub-pixel G is positioned at a second antinode, which is calculated from the second electrode 16 (reflecting electrode), of the standing wave of the green light in the green sub-pixel G.

Figure 7A:
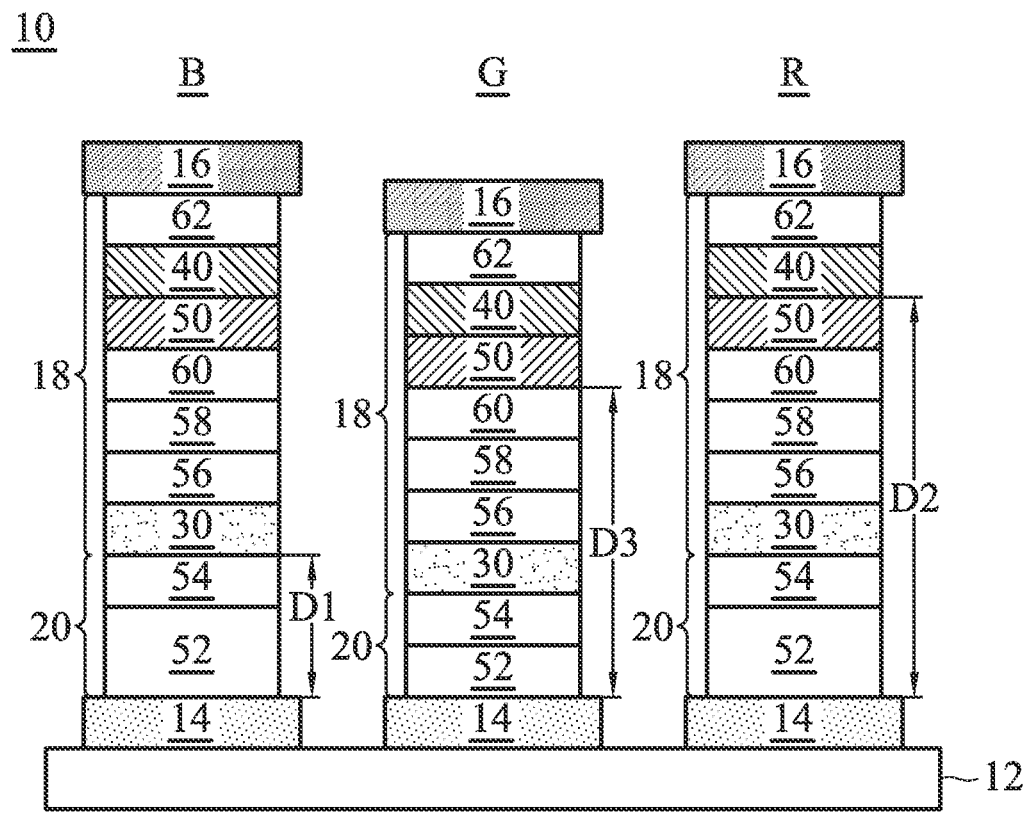

According to another embodiment of the disclosure, the organic light-emitting device 10 can be a bottom-emission organic light-emitting device, and the optical path adjustment layer 20 can be positioned between the first electrode 14 and the organic light-emitting element 18, as shown in FIG. 7A.

In the embodiment of FIG. 7A, each blue sub-pixel B, green sub-pixel G, and red sub-pixel R includes a first electrode 14 (a transflective electrode), an optical path adjustment layer 20 formed on the first electrode 14, an organic light-emitting element 18 formed on the optical path adjustment layer 20, a second electrode 16 (a reflecting electrode) formed on the organic light-emitting element 18. In particular, the organic light-emitting element 18 subsequently includes a blue light-emitting layer 30, an electron transport layer 56, a charge generation layer 58, a hole injection layer 60, a green light-emitting layer 50, a red light-emitting layer 40, and an electron transport layer 62. The optical path adjustment layer 20 includes a transparent conductive layer 52, and a hole injection layer 54.

In this embodiment, the thickness of the hole injection layer 54 of the optical path adjustment layer 20 of the blue sub-pixel B, the red sub-pixel R, and the green sub-pixel G are fixed. Therefore, the thickness of the optical path adjustment layer 20 can be controlled by increasing or reducing the thickness of the transparent conductive layer 52 of the optical path adjustment layer 20, resulting in that the blue light-emitting layer 30 of the blue sub-pixel B, the red light-emitting layer 40 of the red sub-pixel R, and the green light-emitting layer 50 of the green sub-pixel G are positioned at the antinodes of corresponding standing waves respectively. In this embodiment, the minimum optical path length D1 of the blue light from the blue light-emitting layer 30 to the first electrode 14 in the blue sub-pixel B, the minimum optical path length D3 of the green light from the green emitting layer 50 to the first electrode 14 in the green sub-pixels G, and the minimum optical path length D2 of the red light from the red light-emitting layer 40 to the first electrode 14 in the red sub-pixel R are determined by the resonance equation and the antinode equation, resulting in that the thickness of the optical path adjustment layer 20 of the blue sub-pixel B is the same or substantially the same as the thickness of the optical path adjustment layer 20 of the red sub-pixel R (i.e. the thickness of the transparent conductive layer 52 of the blue sub-pixel B is the same or substantially the same as the thickness of the transparent conductive layer 52 of the red sub-pixel R). Therefore, an additional processing step for forming an optical path adjustment layer with different thickness in comparison with the optical path adjustment layer 20 of the blue sub-pixel B can be saved.

Figure 7B:
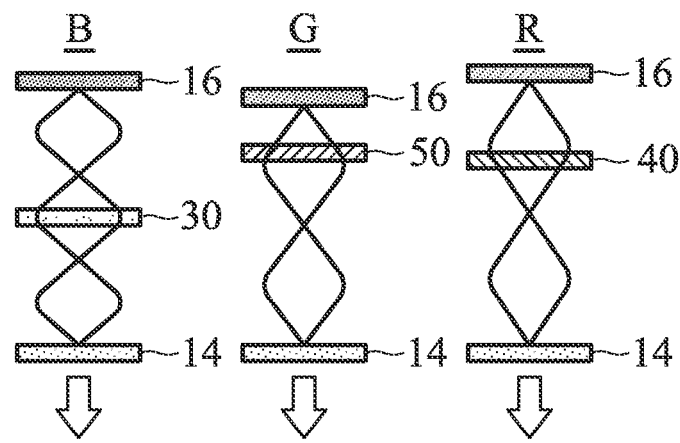

In this embodiment, the minimum optical path length D1 can range between 237 nm and 351 nm (such as 294 nm), the minimum optical path length D2 can range between 349 nm and 505 nm (such as 427 nm), and the minimum optical path length D3 can range between 270 nm and 400 nm (such as 335 nm). As shown in FIG. 7B, the blue color light-emitting layer 30 of the blue sub-pixel B is positioned at a second antinode, which is calculated from the first electrode 14 (transflective electrode), of the standing wave of the blue light in the blue sub-pixel B; the red color light-emitting layer 40 of the red sub-pixel R is positioned at a second antinode, which is calculated from the first electrode 14 (transflective electrode), of the standing wave of the red light in the red sub-pixel R; and the green color light-emitting layer 50 of the green sub-pixel G is positioned at a second antinode, which is calculated from the first electrode 14 (transflective electrode), of the standing wave of the green light in the green sub-pixel G. Furthermore, the blue color light-emitting layer 30 of the blue sub-pixel B is positioned at a second antinode, which is calculated from the second electrode 16 (reflecting electrode), of the standing wave of the blue light in the blue sub-pixel B; the red color light-emitting layer 40 of the red sub-pixel R is positioned at a first antinode, which is calculated from the second electrode 16 (reflecting electrode), of the standing wave of the red light in the red sub-pixel R; and the green color light-emitting layer 50 of the green sub-pixel G is positioned at a first antinode, which is calculated from the second electrode 16 (reflecting electrode), of the standing wave of the green light in the green sub-pixel G.

According to other embodiments of the disclosure, the organic light-emitting device can be a bottom-emission organic light-emitting device, and the thickness of the optical path adjustment layer 20 can be adjusted by increasing or reducing the thickness of the hole injection layer 54. Namely, the thickness of the transparent conductive layers 52 of the optical path adjustment layers 20 in the blue sub-pixel B, the red sub-pixel R, and the green sub-pixel G are fixed, as shown in FIG. 8.

Figure 8:
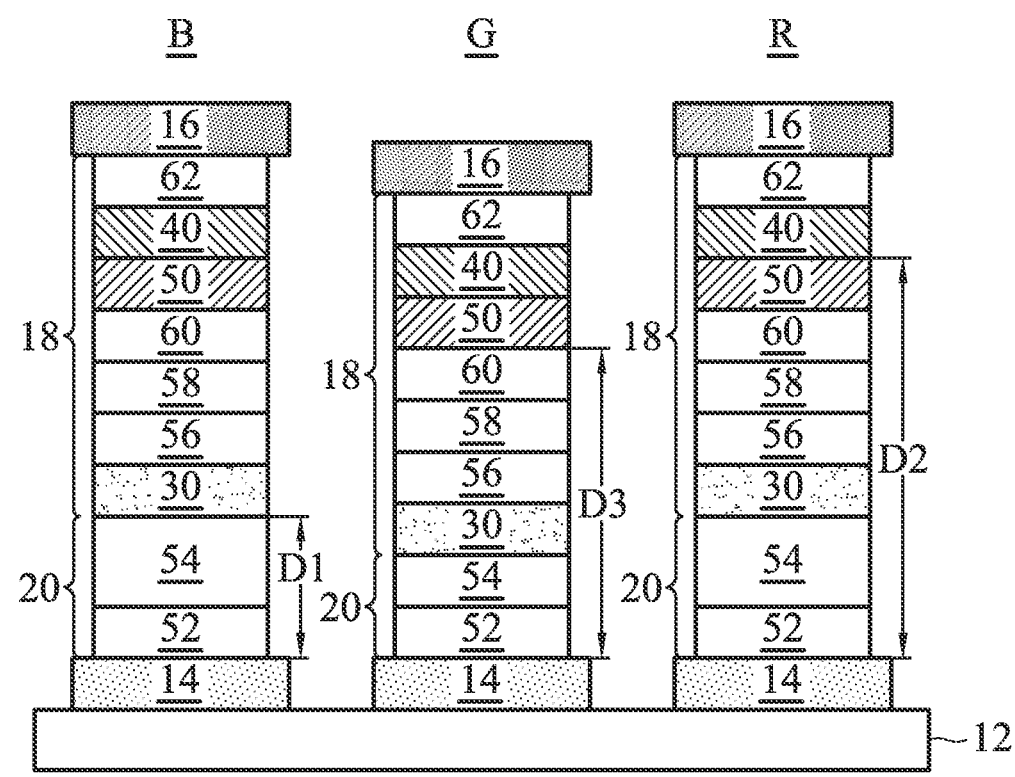

The difference between the embodiments shown in FIG. 7A and FIG. 8 is that the thickness of the optical path adjustment layer 20 of the embodiment shown in FIG. 8 is controlled by adjusting the thickness of the hole injection layer 54. In this embodiment of FIG. 8, the ranges of the minimum optical path length D1, the minimum optical path length D2, and the minimum optical path length D3 are the same as those of the embodiment of FIG. 7A. In the embodiment of FIG. 8, the blue color light-emitting layer 30 of the blue sub-pixel B is positioned at a second antinode, which is calculated from the first electrode 14 (transflective electrode), of the standing wave of the blue light in the blue sub-pixel B; the red color light-emitting layer 40 of the red sub-pixel R is positioned at a second antinode, which is calculated from the first electrode 14 (transflective electrode), of the standing wave of the red light in the red sub-pixel R; and the green color light-emitting layer 50 of the green sub-pixel G is positioned at a second antinode, which is calculated from the first electrode 14 (transflective electrode), of the standing wave of the green light in the green sub-pixel G. Furthermore, the blue color light-emitting layer 30 of the blue sub-pixel B is positioned at a second antinode, which is calculated from the second electrode 16 (reflecting electrode), of the standing wave of the blue light in the blue sub-pixel B; the red color light-emitting layer 40 of the red sub-pixel R is positioned at a first antinode, which is calculated from the second electrode 16 (reflecting electrode), of the standing wave of the red light in the red sub-pixel R; and the green color light-emitting layer 50 of the green sub-pixel G is positioned at a first antinode, which is calculated from the second electrode 16 (reflecting electrode), of the standing wave of the green light in the green sub-pixel G (The schematic diagram of the embodiment shown in FIG. 8 is the same as FIG. 7B).

Figure 9:
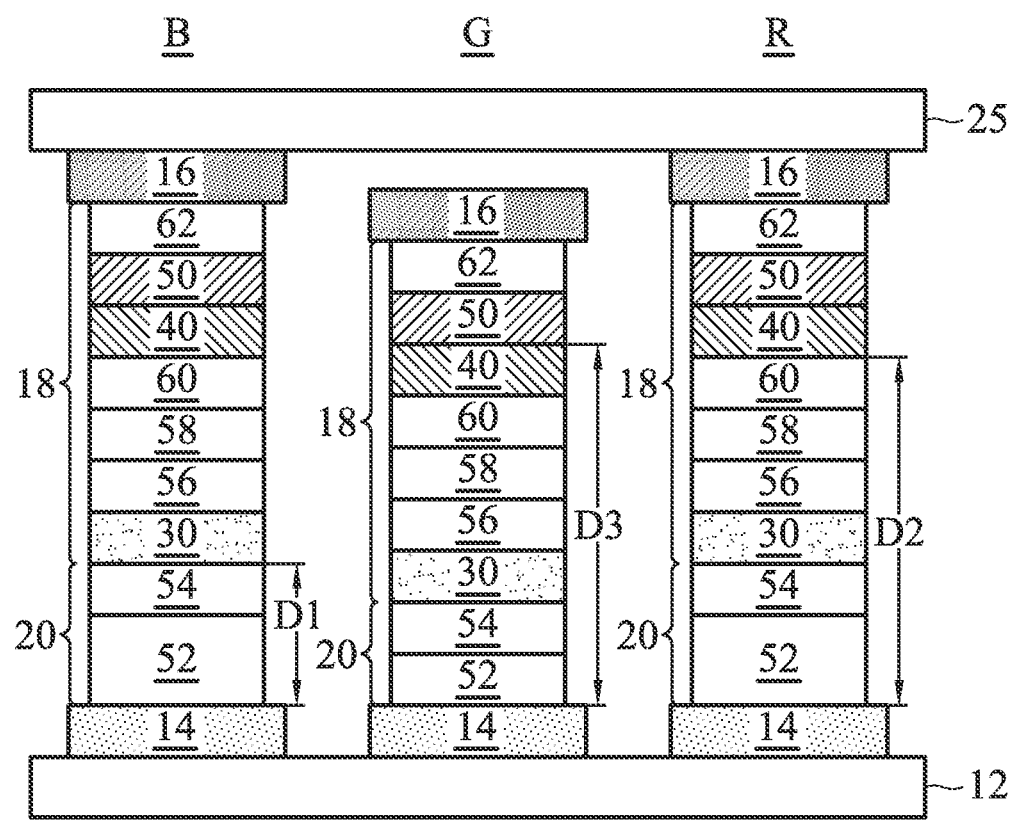
FIG. 9 is a cross-sectional view showing the structure of the pixel of an organic light-emitting device according an embodiment of the disclosure, wherein a transparent package substrate is disposed on second electrode.
Figure 10:
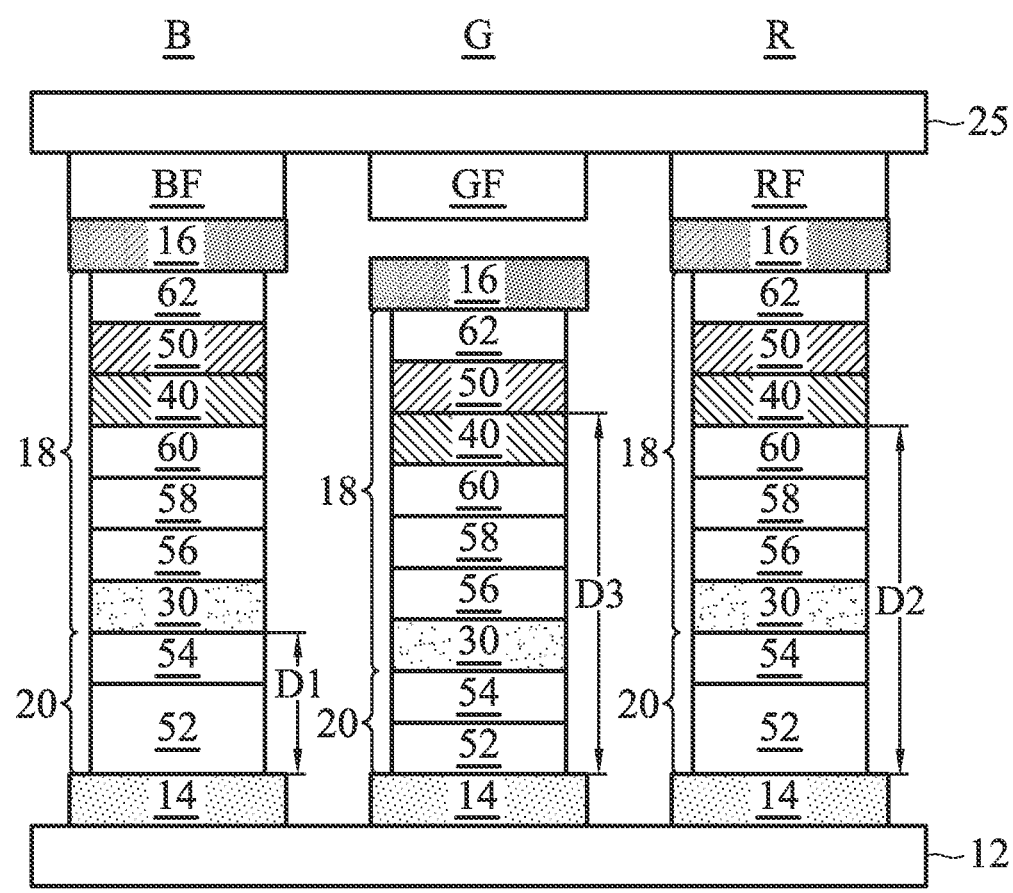
FIG. 10 is a cross-sectional view showing the structure of the pixel of an organic light-emitting device according an embodiment of the disclosure, wherein a color filter is disposed between the transparent package substrate and the second electrode.
Figure 11:
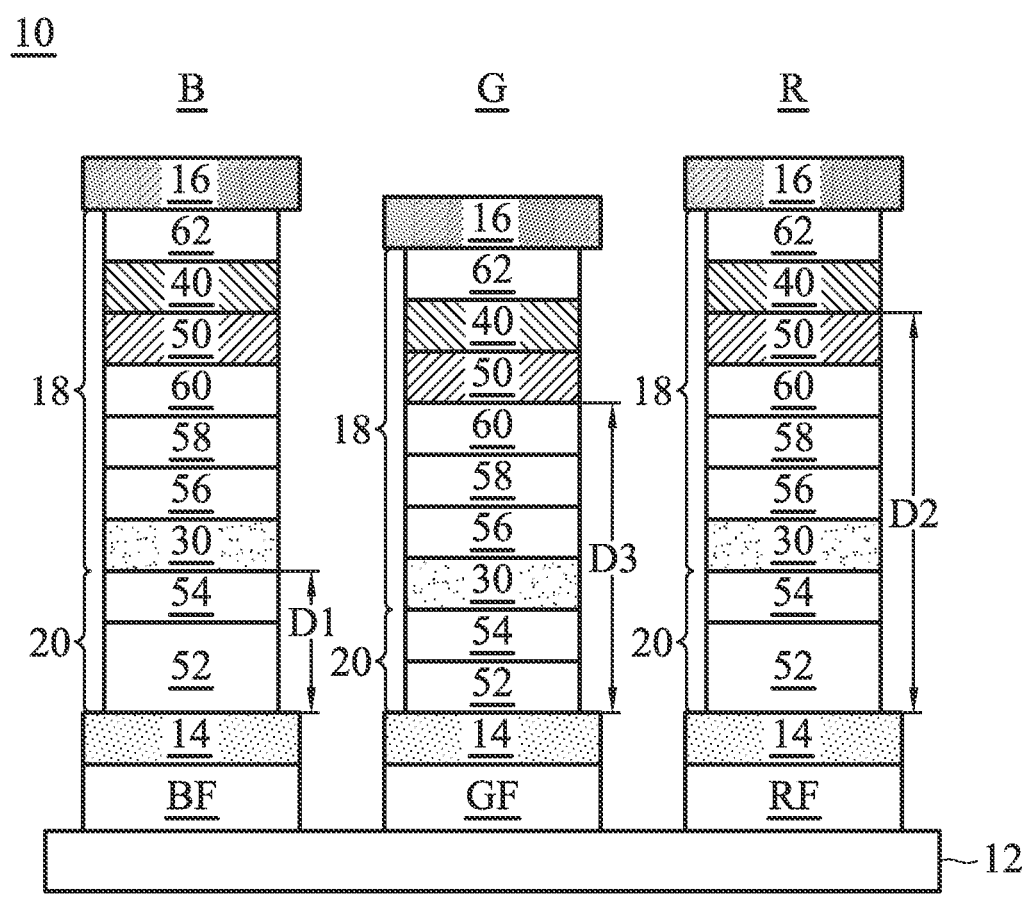
FIG. 11 is a cross-sectional view showing the structure of the pixel of an organic light-emitting device according an embodiment of the disclosure, wherein a color filter is disposed between the substrate and the first electrode.

According to other embodiments of the disclosure, a top-emission organic light-emitting device 10 can further includes a transparent package substrate 25 disposed on the second electrode 16, as shown in FIG. 9. The organic light-emitting device 10 shown in FIG. 9 can be a grayscale-type illuminating device, or a display system. In addition, according to some embodiments of the disclosure, a blue color filter BF, a green color filter GF, and a red color filter RF can further be disposed on the top surface of the transparent package substrate 25. In particular, the blue color filter BF, the green color filter GF, and the red color filter RF respectively correspond to the blue sub-pixels B, the green sub-pixels G, and the red sub-pixels R, thereby achieving a full-color organic light-emitting device 10, as shown in FIG. 10. Furthermore, when the organic light-emitting device 10 is a bottom-emission organic light-emitting device, the blue color filter BF, the green color filter GF, and the red color filter RF (respectively corresponding to the blue sub-pixels B, the green sub-pixels G, and the red sub-pixels R) can be disposed between the first electrode 14 and the substrate 12, thereby achieving a full-color organic light-emitting device 10, as shown in FIG. 11.

Figure 12:
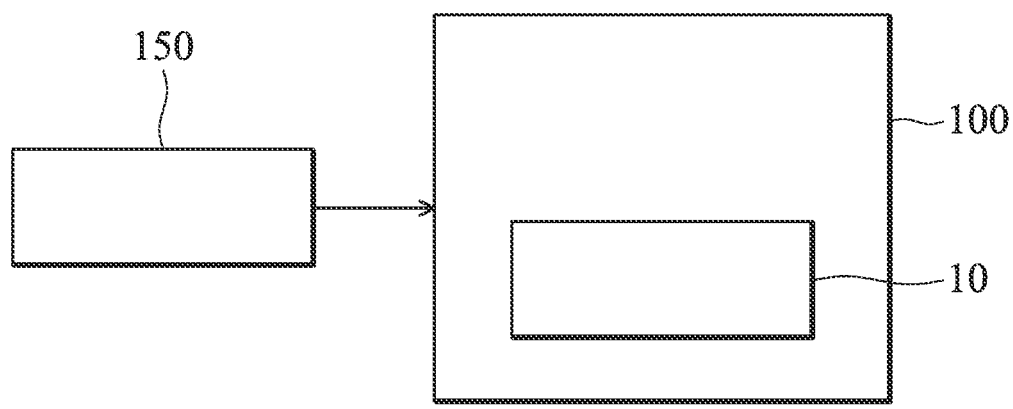
FIG. 12 schematically shows a block diagram of a display system according to an embodiment of the disclosure.

FIG. 12 schematically shows a display system according to another embodiment of the disclosure which, in this case, is implemented as a display device 100 or an electronic device 200, such as a mobile phone, digital camera, PDA (personal data assistant), notebook computer, desktop computer, television, car display, or portable player. The described organic light-emitting device 10 can be incorporated into the display device 100, thereby achieving a full-color organic light-emitting display system. Furthermore, as shown in FIG. 12, the electronic device 200 can include the display device 100 and an input unit 150. The input unit 150 is operatively coupled to the display device 100 and provides input signals (e.g., an image signal) to the display device 100 to generate images.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An organic light-emitting device, comprising:
    a substrate; and
    an organic light-emitting pixel array, wherein the organic light-emitting pixel array comprises a plurality of pixels, and each pixel comprises a first sub-pixel, a second sub-pixel, and a third sub-pixel, and wherein the pixel comprises:
    a first electrode disposed on the substrate;
    an organic light-emitting element disposed on the first electrode, wherein the organic light-emitting element comprises a first color light-emitting layer in the first sub-pixel, a second color light-emitting layer in the second sub-pixel, and a third color light-emitting layer in the third sub-pixel, and wherein the first color light-emitting layer emits a first color light, the second color light-emitting layer emits a second color light, and the third color light-emitting layer emits a third color light different from the first color light and the second color light;
    a second electrode disposed on the organic light-emitting element; and
    an optical path adjustment layer disposed between the first electrode and the second electrode, wherein the thickness of the optical path adjustment layer on the first electrode in the first sub-pixel is substantially the same as the thickness of the optical path adjustment layer on the first electrode in the second sub-pixel, wherein the thickness of the optical path adjustment layer on the first electrode in the third sub-pixel is different from the thickness of the optical path adjustment layer on the first electrode in the first sub-pixel.

2. The organic light-emitting device as claimed in claim 1, wherein the optical path adjustment layer of the first sub-pixel contacts the first electrode or the second electrode, and wherein the minimum optical path length of the first color light from the first color light-emitting layer of the first sub-pixel to the electrode contacted with the optical path adjustment layer is between 194 nm and 351 nm, wherein the first sub-pixel is a blue sub-pixel, the second sub-pixel is a red sub-pixel, wherein the first color light-emitting layer, the second color light-emitting layer, and the third color light-emitting layer are disposed in each of the first, the second, and the third sub-pixel.

3. The organic light-emitting device as claimed in claim 1, wherein the optical path adjustment layer of the second sub-pixel contacts the first electrode or the second electrode, and wherein the minimum optical path length of the second color light from the second color light-emitting layer of the second sub-pixel to the electrode contacted with the optical path adjustment layer is between 327 nm and 505 nm, wherein the first sub-pixel is a blue sub-pixel, the second sub-pixel is a red sub-pixel, wherein the first color light-emitting layer, the second color light-emitting layer, and the third color light-emitting layer are disposed in each of the first, the second, and the third sub-pixel.

4. The organic light-emitting device as claimed in claim 1, wherein the organic light-emitting device is a top-emission organic light-emitting device, and wherein the first electrode is a reflecting electrode, and the second electrode is a transparent electrode or a transflective electrode, wherein the first color light generates a first standing wave within the first sub-pixel and the first color light-emitting layer of the first sub-pixel is positioned at an antinode of the first standing wave, and wherein the second color light generates a second standing wave within the second sub-pixel and the second color light-emitting layer of the second sub-pixel is positioned at an antinode of the second standing wave.

5. The organic light-emitting device as claimed in claim 4, wherein the optical path adjustment layer is disposed between the first electrode and the organic light-emitting element and contacts the first electrode, wherein the first color light-emitting layer of the first sub-pixel is positioned at a second antinode, which is calculated from the first electrode, of the first standing wave, wherein the second color light-emitting layer of the second sub-pixel is positioned at a second antinode, which is calculated from the first electrode, of the second standing wave.

6. The organic light-emitting device as claimed in claim 4, wherein the optical path adjustment layer is disposed between the second electrode and the organic light-emitting element and contacted with the second electrode, wherein the first color light-emitting layer of the first sub-pixel is positioned at a second antinode, which is calculated from the first electrode, of the first standing wave, wherein the second color light-emitting layer of the second sub-pixel is positioned at a first antinode, which is calculated from the first electrode, of the second standing wave.

7. The organic light-emitting device as claimed in claim 1, wherein the organic light-emitting device is a bottom-emission organic light-emitting device, wherein the first electrode is a transparent electrode or a transflective electrode and the second electrode is a reflecting electrode, wherein the first color light generates a first standing wave within the first sub-pixel and the first color light-emitting layer of the first sub-pixel is positioned at an antinode of the standing wave, wherein, the second color light generates a second standing wave within the second sub-pixel and the second color light-emitting layer of the second sub-pixel is positioned at an antinode of the second standing wave.

8. The organic light-emitting device as claimed in claim 7, wherein the optical path adjustment layer is disposed between the second electrode and the organic light-emitting element and contacted with the second electrode, wherein the first color light-emitting layer of the first sub-pixel is positioned at a second antinode, which is calculated from the first electrode, of the first standing wave, wherein the second color light-emitting layer of the second sub-pixel is positioned at a first antinode, which is calculated from the first electrode, of the second standing wave.

9. The organic light-emitting device as claimed in claim 7, wherein the optical path adjustment layer is disposed between the first electrode and the organic light-emitting element and contacted with the first electrode, wherein the first color light-emitting layer of the first sub-pixel is positioned at a second antinode, which is calculated from the first electrode, of the first standing wave, wherein the second color light-emitting layer of the second sub-pixel is positioned at a second antinode, which is calculated from the first electrode, of the second standing wave.

10. A display system, comprising:
    an electronic device, wherein the electronic device comprises:
    a display device, wherein the display device comprises the organic light-emitting device as claimed in claim 1; and
    an input unit coupled to the display device to provide input data to the display device such that the display device displays images.

11. The organic light-emitting device as claimed in claim 1, wherein the first sub-pixel is a blue sub-pixel, the second sub-pixel is a red sub-pixel, and the third sub-pixel is a green sub-pixel, and wherein the thickness of the optical path adjustment layer in the third sub-pixel is smaller than the thickness of the optical path adjustment layer in the first sub-pixel.

12. The organic light-emitting device as claimed in claim 11, wherein the first color light-emitting layer, the second color light-emitting layer, and the third color light-emitting layer are disposed in each of the first, the second, and the third sub-pixel.

13. The organic light-emitting device as claimed in claim 1, wherein the pixel further comprises a first color filter of the first color light disposed corresponding to the first sub-pixel, a second color filter of the second color light, disposed corresponding to the second sub-pixel, and a third color filter of the third color, disposed corresponding to the third sub-pixel.

14. The organic light-emitting device as claimed in claim 1, wherein the thickness of the optical path adjustment layer is uniform.

15. The organic light-emitting device as claimed in claim 12, wherein the optical path adjustment layer is disposed between the first electrode and the first color light-emitting layer, wherein the second color light-emitting layer and the third color light-emitting layer are disposed between the second electrode and the first color light-emitting layer.

16. The organic light-emitting device as claimed in claim 15, wherein the minimum optical path length of the first color light from the first color light-emitting layer of the first sub-pixel to the first electrode is defined as a first minimum optical path length and is between 194 nm and 351 nm, wherein the minimum optical path length of the second color light from the second color light-emitting layer of the second sub-pixel to the first electrode is defined as a second minimum optical path length between 327 nm and 505 nm, and wherein the first minimum optical path length is smaller than the second minimum optical path length.

17. The organic light-emitting device as claimed in claim 12, wherein the optical path adjustment layer is disposed between the second electrode and the first color light-emitting layer, wherein the second color light-emitting layer and the third color light-emitting layer are disposed between the first electrode and the first color light-emitting layer.

18. The organic light-emitting device as claimed in claim 17, wherein the minimum optical path length of the first color light from the first color light-emitting layer of the first sub-pixel to the second electrode is defined as a first minimum optical path length and is between 194 nm and 351 nm, wherein the minimum optical path length of the second color light from the second color light-emitting layer of the second sub-pixel to the second electrode is defined as a second minimum optical path length between 327 nm and 505 nm, and wherein the first minimum optical path length is smaller than the second minimum optical path length.

* * * * *